US012635308B2

(12) United States Patent
Jhin et al.

(10) Patent No.: US 12,635,308 B2
(45) Date of Patent: May 19, 2026

(54) MICRO-LED ELEMENT, METHOD FOR MANUFACTURING THE SAME, AND DISPLAY DEVICE USING THE SAME

(71) Applicant: ADVANCED VIEW TECHNOLOGY, Ansan-si (KR)

(72) Inventors: Jung-Geun Jhin, Ansan-si (KR); Jae-Kyun Kim, Ansan-si (KR)

(73) Assignee: ADVANCED VIEW TECHNOLOGY, Ansan-si (KR)

( * ) Notice: Subject to any disclaimer, the term of this patent is extended or adjusted under 35 U.S.C. 154(b) by 357 days.

(21) Appl. No.: 18/274,610

(22) PCT Filed: Jan. 12, 2022

(86) PCT No.: PCT/KR2022/000563
§ 371 (c)(1),
(2) Date: Jul. 27, 2023

(87) PCT Pub. No.: WO2022/164088
PCT Pub. Date: Aug. 4, 2022

(65) Prior Publication Data
US 2024/0347675 A1 Oct. 17, 2024

(30) Foreign Application Priority Data
Jan. 27, 2021 (KR) ........................ 10-2021-0011765

(51) Int. Cl.
*H10H 20/832* (2025.01)
*H10H 20/01* (2025.01)
(Continued)

(52) U.S. Cl.
CPC ...... *H10H 20/835* (2025.01); *H10H 20/8314* (2025.01); *H10H 20/84* (2025.01);
(Continued)

(58) Field of Classification Search
CPC .. H10H 20/835; H10H 20/8314; H10H 20/84; H10H 29/142; H10H 20/032;
(Continued)

(56) References Cited

U.S. PATENT DOCUMENTS

2017/0317228 A1* 11/2017 Sung ................... H10H 20/0137
2019/0019779 A1* 1/2019 Kwon ................. H01L 25/0753
(Continued)

FOREIGN PATENT DOCUMENTS

KR 10-2016-0017905 A 2/2016
KR 10-2016-0115302 A 10/2016
(Continued)

OTHER PUBLICATIONS

KR-101689164-B1 Translation 2016.*
(Continued)

*Primary Examiner* — Mark W Tornow
(74) *Attorney, Agent, or Firm* — Paratus Law Group, PLLC

(57) ABSTRACT
There is provided a micro-LED device having high applicability to fluid-based assembly technology, which includes: an n-type semiconductor layer; an active layer disposed on the n-type semiconductor layer; a p-type semiconductor layer disposed on the active layer; an insulating layer surrounding at least the outer circumferential surface of the active layer; and a multilayer electrode part disposed at the outer circumferential surface of the insulating layer.

2 Claims, 5 Drawing Sheets

(51) Int. Cl.
    *H10H 20/831*     (2025.01)
    *H10H 20/84*     (2025.01)
    *H10H 29/14*     (2025.01)

(52) U.S. Cl.
    CPC ......... *H10H 29/142* (2025.01); *H10H 20/032*
                (2025.01); *H10H 20/034* (2025.01)

(58) Field of Classification Search
    CPC .. H10H 20/034; H10H 20/831; H10H 20/832;
           H10H 20/857; H10H 20/852; H10H
           29/10; H10H 20/0362; H10H 20/0364;
                H01L 25/075; H01L 25/0753
    See application file for complete search history.

(56)                    References Cited

U.S. PATENT DOCUMENTS

2020/0212267 A1*  7/2020  Kwak ................... H10H 20/819
2022/0165921 A1*  5/2022  Choi .................... H10H 20/857

FOREIGN PATENT DOCUMENTS

| KR | 101689164 B1 * | 12/2016 | ........... H10H 20/832 |
| KR | 10-2019-0007226 A | 1/2019 | |
| KR | 10-2020-0140209 A | 12/2020 | |

OTHER PUBLICATIONS

International Search Report for PCT/KR2022/000563 mailed Apr. 28, 2022 from Korean Intellectual Property Office.
Korean Office Action for related KR Application No. 10-2021-0011765 mailed May 20, 2022 from Korean Intellectual Property Office.

* cited by examiner

MICRO-LED ELEMENT, METHOD FOR MANUFACTURING THE SAME, AND DISPLAY DEVICE USING THE SAME

CROSS-REFERENCE TO PRIOR APPLICATIONS

This Application is a National Stage Patent Application of PCT International Application No. PCT/KR2022/000563 (filed on Jan. 12, 2022), which claims priority to Korean Patent Application No. 10-2021-0011765 (filed on Jan. 27, 2021), which are all hereby incorporated by reference in their entirety.

BACKGROUND

The present disclosure relates to a micro-LED element. The present disclosure specifically relates to a micro-LED element having a multilayer electrode part on the outer circumferential surface thereof, a method for manufacturing the same and a display apparatus using the same.

Micro-LED elements denote LEDs one side of which have a 100 μm or less length. This size of a micro-LED element is about one tenth of the size of an ordinary LED element or less.

Additionally, since an OLED element used for a display is made of an organic material, the OLED element is vulnerable to external air or moisture, and its current injection performance deteriorates.

Unlike an OLED element, a micro-LED element is formed based on an inorganic material such as GaN, AlGaInP and the like. Accordingly, the micro-LED element ensures excellent durability. Further, the micro-LED element has a small size, and thanks to its size, generates a small amount of heat and consumes less electric power. Under the circumstances, research into a technology of applying a micro-LED element to a display apparatus has been conducted.

Display apparatuses display a screen by using a plurality of pixels constituting a display panel. Each pixel is divided into sub pixels that respectively emit a single color such as red (R), green (G) and blue (B). All colors ranging from true black to white can be expressed based on the intensity of each of R, G, and B light.

One pixel requires a micro LED element constituting a sub pixel capable of expressing at least one or more of R, G and B, to express all colors.

A display apparatus to which a micro-LED element is applied has self-emitting properties, and more excellent in a response speed, brightness, color reproduction and lower-power driving properties than an OLED having the same self-emitting properties.

Further, the display apparatus to which a micro-LED element is applied ensures excellent durability and a long lifespan that are inherent in an inorganic element, and readily applied to a mobile display apparatus.

Furthermore, the micro-LED element can be assembled in a module form, and applied to a flexible display apparatus as well as a large-sized display apparatus ensuring an ultra high-quality image.

SUMMARY

The objective of the present disclosure is to provide a micro-LED element exhibiting excellent emission properties.

The objective of the present disclosure is to provide a method for manufacturing a micro-LED element exhibiting excellent emission properties.

The objective of the present disclosure is to provide a display apparatus in which one micro-LED element is assembled to each pixel area.

Aspects according to the present disclosure are not limited to the above ones, and other aspects and advantages that are not mentioned above can be clearly understood from the following description and can be more clearly understood from the embodiments set forth herein. Additionally, the aspects and advantages in the present disclosure can be realized via means and combinations thereof that are described in the appended claims.

A micro-ELD element in the present disclosure may comprise an n-type semiconductor layer; an active layer being disposed on the n-type semiconductor layer; a p-type semiconductor layer being disposed on the active layer; an insulation layer surrounding an outer circumferential surface of the active layer at least; and a multilayer electrode part being disposed on an outer circumferential surface of the insulation layer.

A method for manufacturing a micro-LED element in the present disclosure may comprise (a) preparing a stack in which a n-type semiconductor layer, an active layer, a p-type semiconductor layer, and an insulation layer for removal are consecutively disposed from below; (b) etching a side surface of the stack to remove a thickness of the n-type semiconductor layer partially; (c) etching a side surface of the insulation layer for removal to expose at least a portion of an upper surface of the p-type semiconductor layer; (d) removing the insulation layer for removal, after forming an insulation layer to surround an outer circumferential surface of the active layer at least; and (e) forming a multilayer electrode part on an outer circumferential surface of the insulation layer.

A display apparatus in the present disclosure may comprise a plurality of pixel areas being defined by crossing a data line and a gate line on substrate, the plurality of pixel areas may comprise a pixel circuit part and a display element layer, the display element layer may comprise a first electrode layer connecting to the pixel circuit part electrically, and a second electrode layer being spaced from the first electrode layer electrically, and a micro-LED element being coupled to the first electrode layer and the second electrode layer, and the micro-LED element may comprise an n-type semiconductor layer; an active layer being disposed on the n-type semiconductor layer; a p-type semiconductor layer being disposed on the active layer; an insulation layer surrounding an outer circumferential surface of the active layer at least; and a multilayer electrode part being disposed on an outer circumferential surface of the insulation layer.

In a micro-LED element according to the present disclosure, a multilayer electrode part is disposed on the outer circumferential surface of an insulation layer, ensuring excellent emission properties.

The micro-LED element is highly applicable to a fluid-based assembly technology.

According to the present disclosure, a display apparatus in which one micro-LED element is assembled to each pixel area can be manufactured.

Specific effects are described along with the above-described effects in the section of detailed description.

DESCRIPTION OF REFERENCE NUMERALS

Figure 1A:
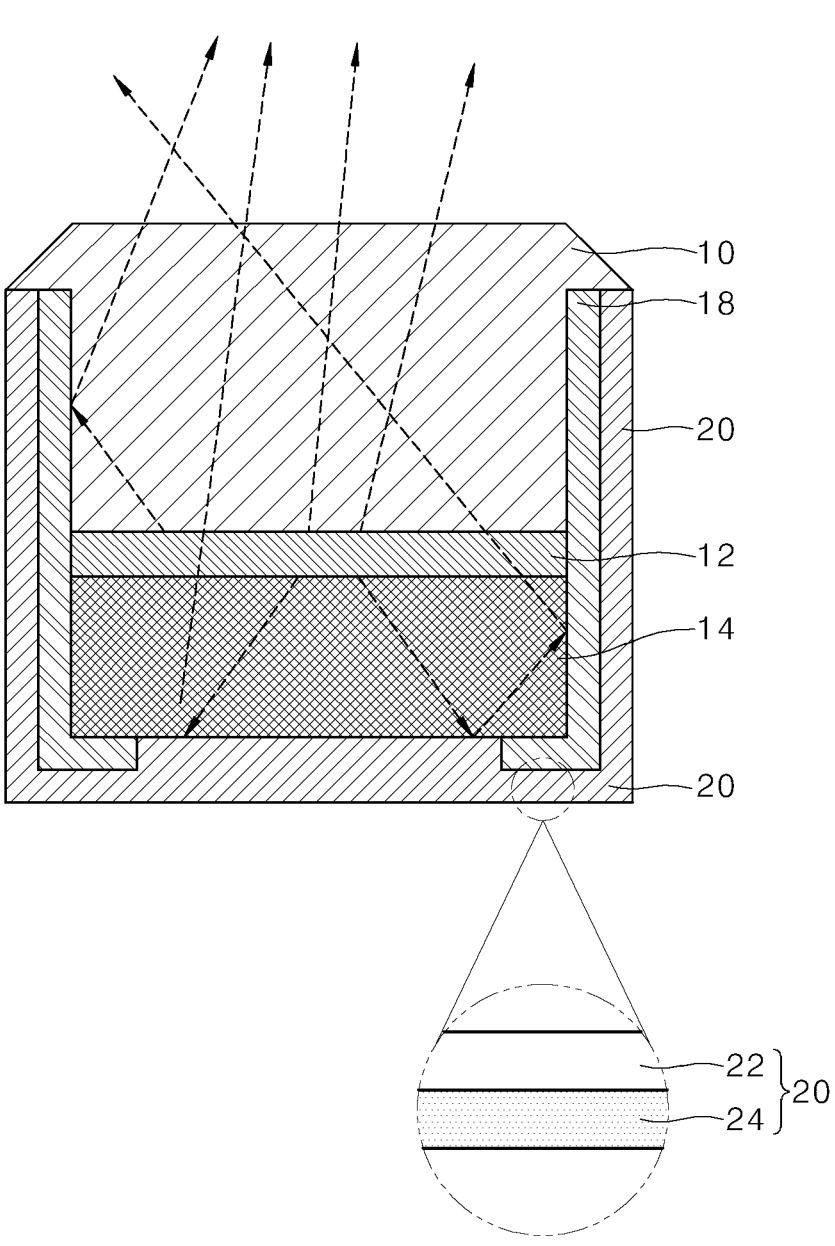
FIGS. 1A and 1B are cross-sectional views showing a micro-LED element according to the present disclosure.

10: n-type semiconductor layer
12: Active layer
14: p-type semiconductor layer
18: Insulation layer
20: Multilayer electrode part
22: First layer
24: Second layer
26: Third layer
30: Insulation layer for removal
40: Substrate
42: Carrier substrate
44: Adhesive
50: Substrate
110: First electrode layer
130: Second electrode layer
140: Contact layer

DETAILED DESCRIPTION

The above-described aspects, features and advantages are specifically described hereafter with reference to accompanying drawings such that one having ordinary skill in the art to which the present disclosure pertains can embody the technical spirit of the disclosure easily. In the disclosure, detailed description of known technologies in relation to the subject matter of the disclosure is omitted if it is deemed to make the gist of the disclosure unnecessarily vague. Hereafter, preferred embodiments according to the disclosure are specifically described with reference to the accompanying drawings. In the drawings, identical reference numerals can denote identical or similar components.

When any one component is described as being "in the upper portion (or lower portion)" or "on (or under)" another component, any one component can be directly on (or under) another component, and an additional component can be interposed between the two components.

When any one component is described as being "connected", "coupled", or "connected" to another component, any one component can be directly connected or coupled to another component, but an additional component can be "interposed" between the two components or the two components can be "connected", "coupled", or "connected" by an additional component.

Hereafter, a micro-LED element, a method for manufacturing the same, and a display apparatus using the same, in several embodiments, are described.

The present disclosure relates to a micro-LED element, and a method for manufacturing the same that is used at a time of fluid-based assembly.

In the present disclosure, the fluid-based assembly process involves arranging micro-LEDs in accurate positions, by forming an electric field of non-uniform magnitude between a first electrode layer and a second electrode layer and disposing micro-LEDs in an arrangement groove in which the micro LEDs distributed in fluid form the strongest electric field, in the case where a trench-structured arrangement groove is formed on a substrate and then a magnetic field is generated.

The micro-LED element according to the present disclosure is a micro light emitting material in the form of a disc or a cube that has an aspect ratio of 0.5 to 2.

According to the present disclosure, the micro-LED element may comprise a first layer that is an ohmic contact electrode electrically connecting to a p-type semiconductor layer 14, a second layer that exhibits excellent reflection properties, and a third layer that is coupled to an electrode provided for dielectrophoresis, ensuring excellent emission properties.

Figure 1B:
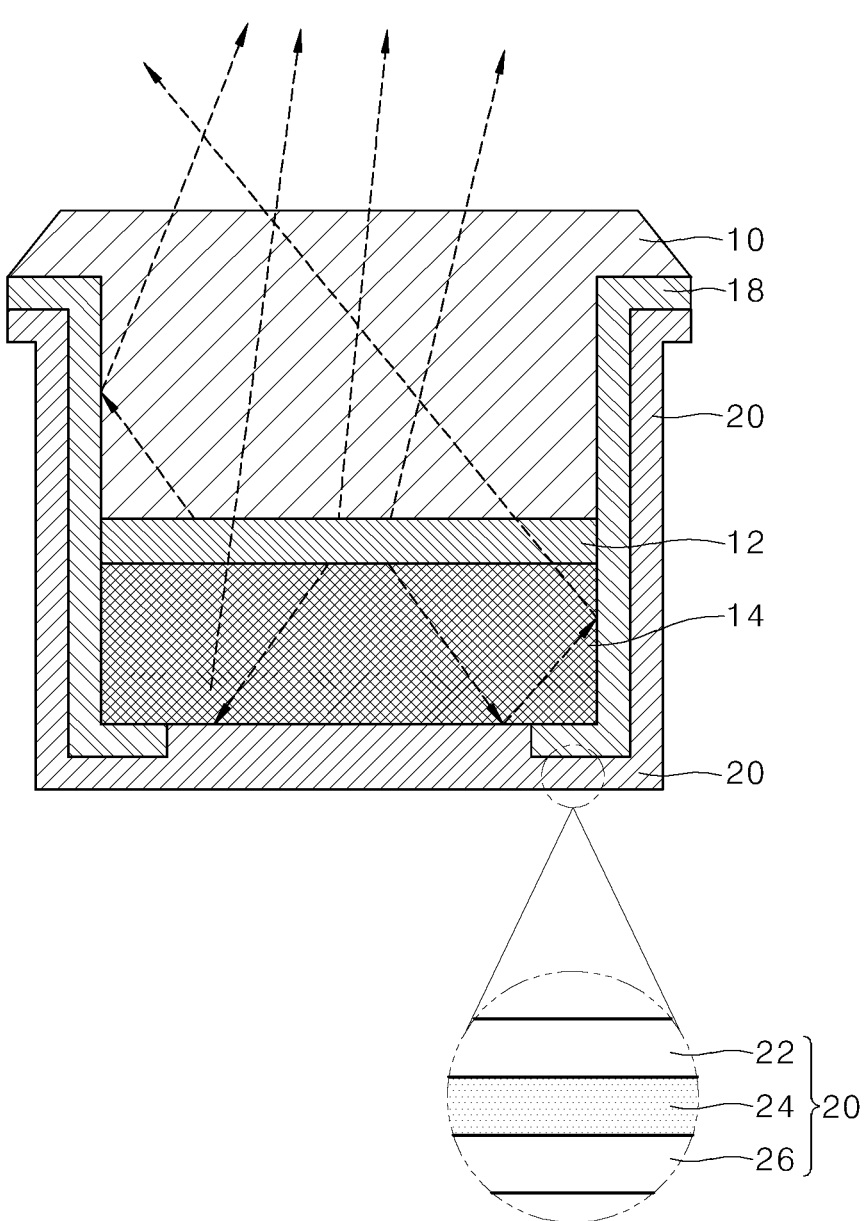

FIGS. 1A and 1B are cross-sectional views showing a micro-LED element according to the present disclosure.

Referring to FIGS. 1A and 1B, the micro-LED element ML according to the present disclosure may comprise an n-type semiconductor layer 10, an active layer 12 disposed on one surface of the n-type semiconductor layer, a p-type semiconductor layer 14 disposed on one surface of the active layer, an insulation layer 18 surrounding the perimeter of the active layer at least, and a multilayer electrode part 20 disposed on the outer circumferential surface of the insulation layer.

The micro-LED element ML has a structure in which the n-type semiconductor layer 10, the active layer 12, and the p-type semiconductor layer 14 are disposed from above.

In the micro-LED element ML, light emitted from the active layer 12 may proceed toward the front of a display apparatus through the n-type semiconductor layer 10.

The micro-LED element ML may be disposed in a way that the n-type semiconductor layer 10 is disposed near the front of the display apparatus, and constitute a light source of a pixel area.

The micro-LED element may comprise a nitride-based semiconductor represented as GaN.

For example, n-GaN may be suggested for the n-type semiconductor layer 10, GaN/InGaN may be suggested for the active layer 12, and p-GaN may be suggested for the p-type semiconductor layer 14.

In the active layer 12, electrons supplied from the n-type semiconductor layer 10, and holes supplied from the p-type semiconductor layer 14 are re-coupled to generate light.

The p-type semiconductor layer 14 has relatively high resistance.

Additionally, a current distribution layer (not illustrated) comprising a metallic material such as Al, Cu, Cr, Ni and the like and/or a transparent conductive oxide (TCO) material such as indium tin oxide (ITO), fluorine-doped tin oxide (FTO) and the like, may be further disposed, for the current distribution of the p-type semiconductor layer 14, but not limited.

The insulation layer 18 is disposed in a way that surrounds the outer circumferential surface of the active layer 12 at least.

The insulation layer 18 is disposed in a way that the insulation layer 18 surrounds the side surfaces of the n-type semiconductor layer 10, the active layer 12, and the p-type semiconductor layer 14, together with the side surface of the active layer 12, and in a way that a portion of one surface, i.e., the bottom surface (the lower surface), of the p-type semiconductor layer 14 is exposed.

Preferably, the insulation layer 18 is not disposed on one surface of the n-type semiconductor layer 10, such that light emitted in the active layer 12 proceeds toward the front surface of the display apparatus through the n-type semiconductor layer 10.

The insulation layer 18 prevents an electric short circuit that may be caused by contact of the active layer 12 with a conductive material except for the n-type semiconductor layer 10 and the p-type semiconductor layer 14. Additionally, in the case where the insulation layer 18 is disposed on the outer circumferential surface of the active layer 12, a defect on the surface of the micro-LED element is minimized to improve the life span and efficiency of the micro-LED element further.

The insulation layer 18 may comprise a transparent insulation material. For example, the insulation layer 18 may comprise one or more sorts of insulation materials such as $SiO_2$, $Si_3N_4$, $Al_2O_3$, AlN, $TiO_2$, but not be limited.

The micro-LED element comprises a multilayer electrode part 20 that surrounds the outer circumferential surface of the insulation layer 18 at least.

Referring to FIG. 1A, the multilayer electrode part 20 comprises a first layer 22 in ohmic contact with the p-type semiconductor layer 14, and a second layer 24 exhibiting excellent reflection properties.

Referring to FIG. 1B, the multilayer electrode part 20 may further comprise a third layer 26 that is coupled to an electrode needed for dielectrophoresis.

The first layer 22 may be disposed on the insulation layer 18, and disposed on one surface of the p-type semiconductor layer 14. The first layer 22 may comprise a material for facilitating the injection of electrical charges, and the sort of metal of the first layer 22 may vary depending on the n-type semiconductor layer and the p-type semiconductor layer.

Preferably, the first layer 22 may comprise one or more sorts of Ni, Cr, Al, Ti and Au.

The second layer 24 is disposed on the first layer 22, and provided to reflect light emitted from the micro-LED element.

The second layer 24 may comprise one or more sorts of Al, Au, Ni, Ti, In, Ag, Mg and Cu that are materials exhibiting excellent reflectivity in the visible light region. Preferably, the second layer 24 may comprise Al, Ag and the like exhibiting excellent reflection properties.

The third layer 26 electrically connects to the electrode while being coupled to the electrode provided for dielectrophoresis. The third layer 26 may be made of a material that is hardly oxidized while being moved easily by the dielectrophoresis.

The third layer 26 may comprise one or more sorts of Pt, Sn, Pb, Cu, Ag and Au.

The first layer 22, the second layer 24, and the third layer 26 may comprise a different material, or the same material.

For example, the first layer 22 may be an ohmic contact electrode that is made of Ni, and the second layer 24 may be an electrode that exhibits excellent reflection properties and is made of Al. The third layer 26 may be an electrode that is made of Pt, for a coupling with a dielectrophoresis-based electrode.

In the micro-LED element ML, light generated in the active layer 12 may be reflected by the side surface of the insulation layer 18 and the multilayer electrode part 20, and proceed further toward the front surface of the display apparatus without loss of the reflected light.

Accordingly, efficiency of the light emitted from the micro-LED element may improve.

Referring to FIG. 1B, in terms of the shape of the micro-LED element, the end portion of the n-type semiconductor layer 10 may extend outward, and the insulation layer 18 and the multilayer electrode part 20 may also extend outward together with the end portion of the n-type semiconductor layer 10.

From a display perspective, the structure in which the end portion of the micro-LED element ML extends outward leads to a minimization of interference of pixels.

As described above, as a disc or cube-type micro light emitting material, the micro-LED element, according to the present disclosure, comprises the insulation layer 18 and the multilayer electrode part 20 that are disposed on the side surface of the element, such that the micro-LED element has excellent emission properties and excellent fluid-based mobility.

Figure 2:
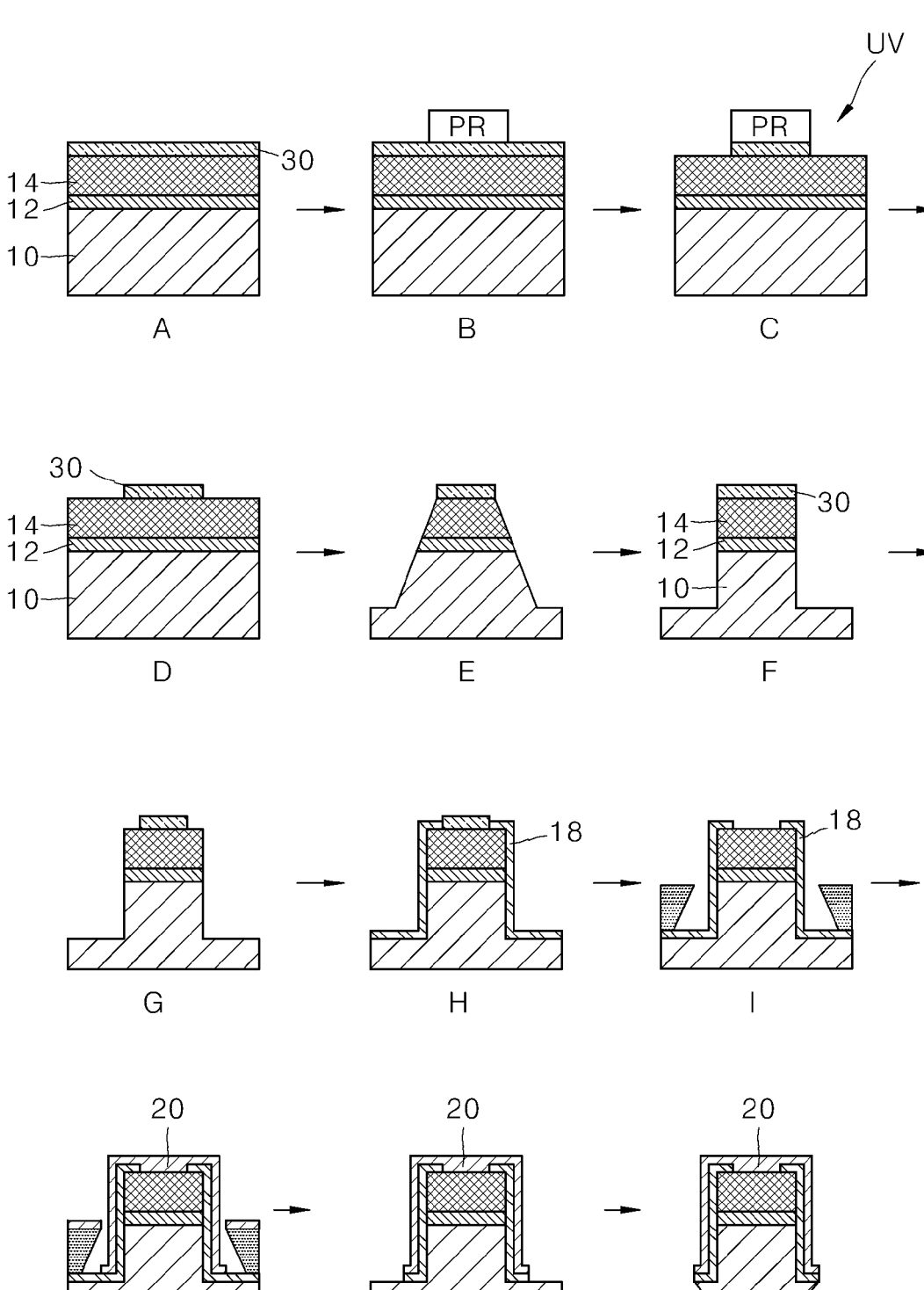
FIG. 2 is a process view showing a process of manufacturing the micro-LED element according to the present disclosure.

FIG. 2 is a process view showing a process of manufacturing the micro-LED element according to the present disclosure.

Referring to FIG. 2, the micro-LED element may be manufactured in the order of A to L.

First, provided is a stack in which the n-type semiconductor layer 10, the active layer 12, the p-type semiconductor layer 14, and the insulation layer for removal 30 are consecutively stacked from below, as shown in the order of FIG. 2A.

Figure 3:
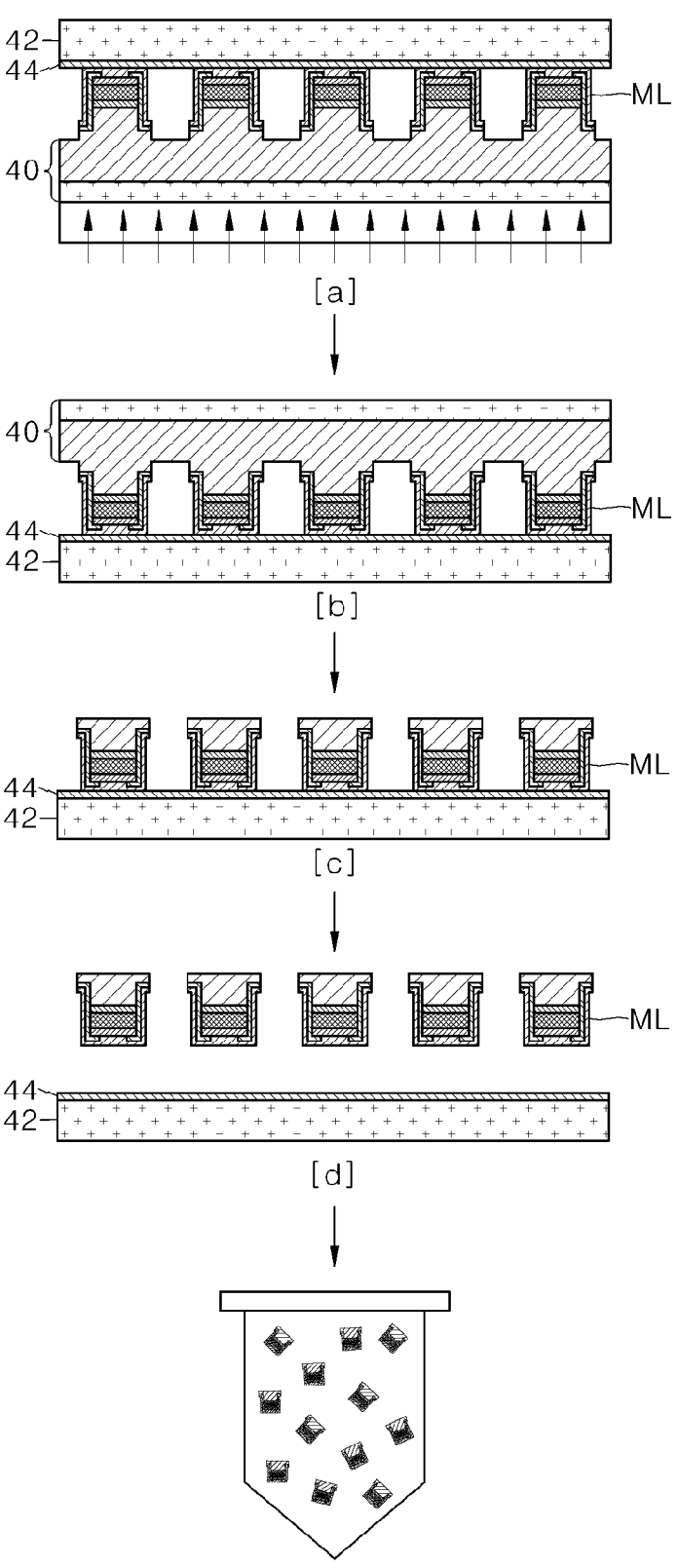
FIG. 3 is a process view showing a process of separating the micro-LED element according to the present disclosure from a substrate.

The n-type semiconductor layer 10, the active layer 12, and the p-type semiconductor layer 14 may be grown on a substrate. The substrate, as illustrated in FIG. 3, may be a sappier substrate or a gallium nitride (GaN) substrate.

The stack may comprise the n-type semiconductor layer 10, the active layer 12, the p-type semiconductor layer 14, and the insulation layer for removal 30. The stack may be manufactured based on physical vapor deposition (PVD), chemical vapor deposition (CVD) or atomic layer deposition (ALD).

Specifically, in the PVD method, thermal evaporation, E-beam evaporation, plasma laser deposition (PLD) or sputtering may be used.

In the CVD method, metal organic chemical vapor deposition (MOCVD), atmosphere pressure chemical vapor deposition (APCVD), low pressure chemical vapor deposition (LPCVD), plasma enhanced chemical vapor deposition (PECVD), high-density plasma chemical vapor deposition (HDPCVD) or atomic layer chemical vapor deposition (ALCVD) may be used.

The insulation layer for removal 30 may comprise one or more sorts of insulation materials including $SiO_2$, $Si_3N_4$, $Al_2O_3$, AlN and $TiO_2$.

Additionally, as a mask, a metallic layer (not illustrated) for removal may be disposed on the insulation layer for removal 30. The metallic layer for removal may comprise one or more sorts of Cr, Al, Ti, Ni, In, Pb, Cu, Ag, Pt and Au.

In relation to the thickness of each layer, the n-type semiconductor layer 10 may have a thickness of greater than 0 μm to 2 μm or less, the active layer 12 may have a thickness of greater than 0 nm to 78 nm or less, the p-type semiconductor layer 14 may have a thickness of greater than 0 nm to 120 nm or less, and the insulation layer for removal 30 may have a thickness of greater than 0 μm to 1 μm or less, but not be limited.

As shown in the order of B to H in FIG. 2, the thickness of the n-type semiconductor layer 10 is partially removed to etch the side surface of the stack.

Additionally, the side surface of the insulation layer for removal 30 may be etched to expose the upper surface of the p-type semiconductor layer 14 at least partially.

Specifically, the step of etching the insulation layer for removal 30 by applying photoresist (PR) on the insulation layer for removal 30 and then irradiating UV, and the step of etching the side surfaces of the n-type semiconductor layer 10, the active layer 12, and the p-type semiconductor layer 14 in a way that the side surfaces are perpendicular to the bottom surface of the n-type semiconductor layer 10 (F in FIG. 2) may be included.

As shown in order B, photoresist may be applied onto the insulation layer 30 for removal.

Before photoresist is applied to the stack, a metallic layer (not illustrated) may be further disposed on the insulation layer for removal 30, and UV may be irradiated, and the metallic layer (not illustrated) may be etched to leave an area to which photoresist is applied, but not limited.

As a photosensitizer that is a material sensitive to light, the photoresist comprises an organic solvent and a polymer material. The organic solvent in the photoresist may be removed after spin coating of the photoresist.

Photoresist is used to form patterns with light, and categorized into negative photoresist and positive photoresist. Since particles of the negative PR are lumped when affected by light. Accordingly, the negative PR, which is not affected by light, is removed at a time when light is irradiated. In the case of a positive PR, a polymer coupling of the positive PR is decoupled when the positive PR is affected by light. Accordingly, the positive PR, which is affected by light, is only removed at a time when light is irradiated.

A mask (not illustrated) is disposed on photoresist, and then UV is irradiated (UV exposure), such that coated photoresist reacts.

In orders B and C, photoresist is used as a mask, for etching (patterning).

A reacting portion of the photoresist needs to be etched selectively.

In the etching step, sputter etching using inert gases, ions and the like, dry etching such as plasma etching, or wet etching using a chemical reaction with a solution may be used.

In order C, the side surface of the insulation layer for removal 30 may be etched by irradiating UV, and as shown in order D, the photoresist may be removed.

The insulation layer for removal 30 may be etched in reactive ion etching (RIE) in addition to etching using PR, but not limited.

The RIE process is a method in which gases such as argon, oxygen and the like are injected into a chamber and then high-frequency RF is injected, and then a magnetic field is formed because of a potential difference at both ends of the chamber while ions are torn away, and the ions rushes at high speeds to etch.

As shown in order E, the n-type semiconductor layer 10, the active layer 12, and the p-type semiconductor layer 14 may be etched. At this time, while the side surface of the stack is removed such that the thickness of the n-type semiconductor layer 10 may be partially removed, the side surface may be etched in a way that the side surface inclines downward from the etched insulation layer for removal 30. The inclination may be made to have an outward gradient.

Additionally, the n-type semiconductor layer 10 may be etched so that the lower area of the n-type semiconductor layer 10 remains at a constant thickness. This means that the n-type semiconductor layer 10 is left without being etched, up to a predetermined height from the bottom surface of the n-type semiconductor layer 10.

In this step, RIE may be performed, and specifically, inductively coupled plasma RIE (ICP-RIE) may be performed.

The ICP-RIE method involves accelerating electrons by a magnetic field and an electric field that are induced by a coil, and generating high-density plasma, to perform etching.

The ICP-RIE process may be performed by injecting $Cl_2$ and/or $BCl_3$.

As shown in order F, the side surfaces of the n-type semiconductor layer 10, the active layer 12, and the p-type semiconductor layer 14 may be etched in a way that the side surface of the stack is perpendicular to the bottom surface of the n-type semiconductor layer 10.

The etching of the side surface of the stack may be performed based on wet etching using a solution such as KOH and the like.

As shown in order G, the side surface of the insulation layer for removal 30 may be etched in a way that the upper surface of the p-type semiconductor layer 14 is exposed at least partially.

The etching of the side surface of the insulation layer for removal 30 may be performed in an ozone atmosphere.

Further, to manufacture the micro-LED element in FIG. 1A, the insulation layer 18 and the multilayer electrode part 20 may not be formed in the outwardly extending end portion of the micro-LED element in orders of H to L of FIG. 2.

Suppose that the micro-LED element in FIG. 1b is manufactured in orders of H to L of FIG. 2.

As shown in orders H and I of FIG. 2, the insulation layer 18 may be formed to surround the outer circumferential surface of the active layer 12 at least, and then the insulation layer 30 for removal may be removed.

As shown in order H, the insulation layer 18 serving as a protective layer may be formed to surround the side surface of the stack. The insulation layer 18 formed on the side surface of the stack is illustrated in order H. However, the insulation layer 18 may also be formed on the upper surface of the insulation layer for removal 30.

The insulation layer 18 may be formed to surround the side surfaces of the n-type semiconductor layer 10 and the p-type semiconductor layer 14, together with the side surface of the active layer 12.

In terms of the formation of the element, the insulation layer 18 may also be formed in an outwardly extending end portion of the outer circumferential surface of the n-type semiconductor layer 10.

The formation of the insulation layer 18 may be performed based on PVD, CVD or ALD, e.g., sputtering.

In the case where the insulation layer for removal 30 is removed from the stack as shown in order I, a portion of one surface of the p-type semiconductor 14 remains exposed.

To remove the insulation layer for removal 30, a lift-off method may be used.

As shown in orders J to L of FIG. 2, the multilayer electrode part may be formed on the outer circumferential surface of the insulation layer 18.

As shown in order J, the first layer 22, the second layer 24 and the third layer 26 may be consecutively formed on the insulation layer 18.

The first layer 22 is an electrode in ohmic contact with the p-type semiconductor layer 14, the second layer 24 is an electrode exhibiting excellent reflection properties, and the third layer 26 is an electrode being coupled to an electrode required for dielectrophoresis.

The first layer 22, the second layer 24 and the third layer 26 may be formed respectively based on PVD, CVD or ALD. For example, each of the first layer 22, the second layer 24 and the third layer 26 may be deposited based on sputtering.

The first layer 22 may be 600 nm or less thick, the second layer 24 is 100 nm or less thick, and the third layer 26 is 600 nm or less thick, but not limited.

As shown in order k, the insulation layer 18 and/or the multilayer electrode part 20 formed in the outwardly extending end portion of the outer circumferential surface of the n-type semiconductor layer 10 may be etched.

The etching of the insulation layer 18 and/or the multilayer electrode part 20 formed in the end portion may be performed based on wet etching such as buffered oxide etching (BOE).

The buffered oxide etching method involves soaking the stack in a solvent comprising hydrogen fluoride (HF), to perform etching.

As shown in order L, the outwardly extending end portion of the outer circumferential surface of the n-type semiconductor layer 10 may be etched in a way that the lower surface of the outwardly extending end portion inclines downward, i.e., in a way that the width of the outwardly extending end portion decreases.

This step may be performed by injecting $Cl_2$ and/or $BCl_3$, based on ICP-RIE.

The micro-LED element comprising the n-type semiconductor layer 10, the active layer 12 disposed on the n-type semiconductor layer 10, the p-type semiconductor layer 16 disposed on the active layer 12, the insulation layer 18 surrounding the outer circumferential surface of the active layer 12 at least, and the multilayer electrode part 20 disposed on the outer circumferential surface of the insulation layer 18 may be manufactured based on orders A to L of FIG. 2.

FIG. 3 is a process view showing a process of separating the micro-LED element according to the present disclosure from a substrate.

As illustrated in FIG. 3[a], after a carrier substrate 42 comprising an adhesive 44 is disposed on the micro-LED element, the carrier substrate 42 may weld to the micro-LED element based on a bolding method using heat and pressure. The multilayer electrode part 20 included in the micro-LED element may weld to the adhesive 44 of the carrier substrate 42.

As illustrated in FIG. 3[b], the bond may be removed based on the laser lift-off (LLO) method.

As illustrated in FIG. 3[c], the wet etching may be performed, and the substrate 40 may be removed from the micro-LED element.

Finally, as illustrated in FIG. 3[d], the micro-LED element may separate by separating the carrier substrate 42 comprising the adhesive 44 from the micro-LED element.

The separate micro-LED element is mixed in a solution, and applicable to a fluid-based assembly technology.

A display apparatus comprising the micro-LED element according to the present disclosure is described.

The display apparatus of the present disclosure may have a structure in which the positions of the transistors and the micro-LED element vary.

For example, in the display apparatus, the micro-LED element is disposed on the same planar surface as the transistors, or disposed on the transistors. However, the positions of the transistors and the micro-LED element may vary, depending on embodiments, and not be limited.

Figure 4:
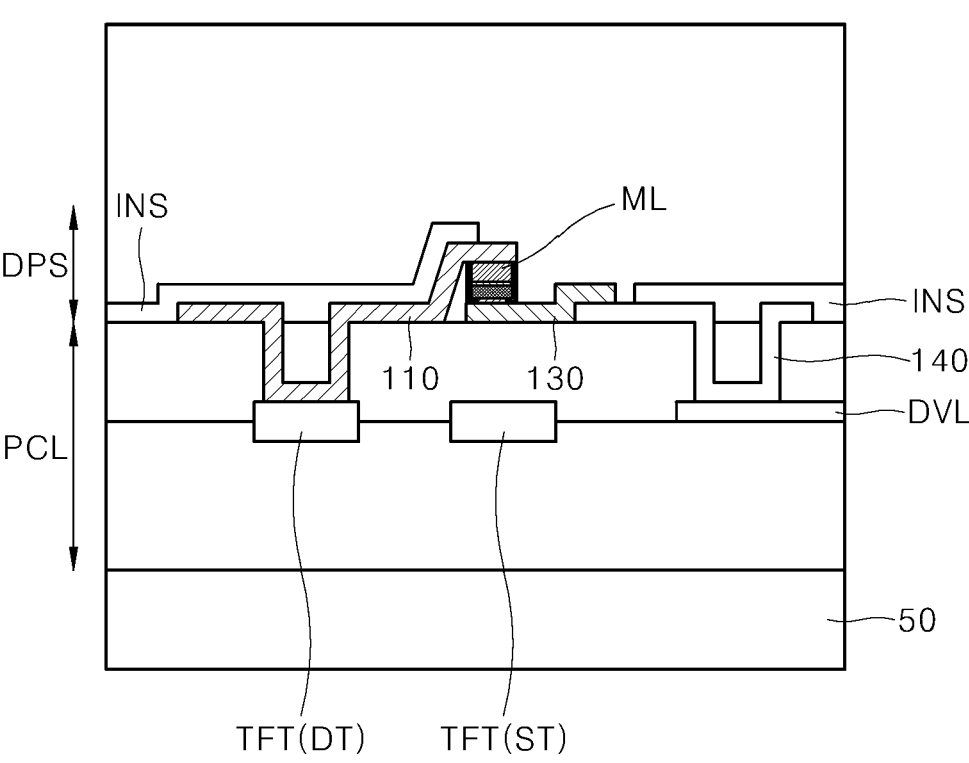
FIG. 4 is a cross-sectional view showing a pixel area of a display apparatus according to the present disclosure.

FIG. 4 is a cross-sectional view showing a pixel area of a display apparatus according to the present disclosure.

FIG. 4 shows a structure in which the micro-LED element is disposed on a pixel circuit part, but the structure is provided as an example and not limited.

Additionally, FIG. 4 shows an insulation layer INS and a driving voltage line DVL, but is not limited.

FIG. 4 shows one pixel area, and herein, a pixel may be a minimum unit.

The display apparatus according to the present disclosure may comprise a plurality of pixel areas that is defined by crossing a data line and a gate line on a substrate 50.

Each pixel area may comprise a pixel circuit part PCL and a display element layer DPL.

The pixel circuit part PCL may comprise at least one or more of transistors and a driving voltage line DVL.

The display element layer DPL may comprise a first electrode layer 110 electrically connecting to the pixel circuit part PCL, a second electrode layer 130 electrically connecting to the first electrode layer 110, and a micro-LED element ML being coupled o the first electrode layer 110 and the second electrode layer 130.

The first electrode layer 110 may connect to a source electrode or a drain electrode of the transistor DT disposed at the pixel circuit part PCL.

The second electrode layer 130 connects to a power voltage line $V_{DD}$ or a base voltage line Vss. The second electrode layer 130 may connect to the driving voltage line DVL through a contact electrode 140, but not be limited.

In the display apparatus of the present disclosure, one pixel may comprise two transistors ST, DT, one capacitor (not illustrated) and a micro-LED element ML that are formed on a substrate 50.

In the display apparatus of the present disclosure, one micro-LED element may be disposed in one pixel area.

In the present disclosure, a transistor refers to a driving transistor DT. In the transistor, each of the first electrode and the second electrode may be any one of the source electrode and the drain electrode.

In the present disclosure, suppose that the first electrode is a source electrode while the second electrode is a drain electrode.

A gate electrode of a switching transistor ST connects to a gate line GL, and a source electrode of the switching transistor ST connects to a data line DL.

A drain electrode of the switching transistor ST connects to a gate electrode of the driving transistor DT and a first end of a storage capacitor Cst.

The switching transistor ST connects the data line DL and the gate electrode of the driving transistor DT in response to a signal that is supplied through the gate line GL.

The gate electrode of the driving transistor DT connects to a drain electrode of the switching transistor ST through a via Via3.

A source electrode of the driving transistor DT connects to a ground GND through a via Via1.

A drain electrode of the driving transistor DT connects to the micro-LED element ML.

A gate insulation layer is formed on the gate electrode of the diving transistor DT.

The gate insulation layer is formed to surround the gate electrode. An active layer is formed on the gate insulation layer. The active layer is formed in a partial area on the gate insulation layer.

The driving transistor DT allows current corresponding to a voltage charging the storage capacitor Cst to flow from the power voltage line VDD to the ground GND through the micro-LED element ML.

The storage capacitor Cst is connected between the gate electrode of the driving transistor DT and the ground GND.

The micro-LED element ML is connected between the drain electrode of the driving transistor DT and the power voltage line VDD. Specifically, the micro-LED element ML may also connect a drain electrode and a power electrode.

A first end of the micro-LED element ML connects to the drain electrode of the driving transistor DT. A second end of the micro-LED element ML connects to the power voltage line VDD.

A line supplying the power voltage line VDD may be formed in a layer different from the driving transistor DT. At this time, the power electrode and the power voltage line VDD may connect through a via Via2.

In the micro-LED element ML of the present disclosure, the n-type semiconductor layer 10, the active layer 12, and the p-type semiconductor layer 14 are disposed from above, and the micro-LED element ML may comprise the insulation layer 18 surrounding the perimeter of the active layer at least, and a multilayer electrode part 20 being disposed on the outer circumferential surface of the insulation layer 18.

In the micro-LED element ML, the n-type semiconductor layer 10 is disposed near the front surface of the display apparatus, and light emitted from the active layer 12 may proceed toward the front surface of the display apparatus through the n-type semiconductor layer 10.

That is, the micro-LED element ML may constitute a light source of the pixel area.

Transistors can be categorized into an inverted stagger structure (a bottom gate-type structure) and a stagger structure (a top gate-type structure), based on the position of the gate electrode 121. Additionally, According to the arrangement of the gate electrode 121 and the active layer 125, the transistors can be categorized into four structures including 1) a bottom gate top contact structure, 2) a bottom gate bottom contact structure, 3) a top gate top contact structure, and 4) a top gate bottom contact structure.

The transistor according to the present disclosure has any one of the four structures.

The gate electrode may comprise at least one of metal such as aluminum (Al), copper (Cu), tantalum (Ta) and the like or a metal nitride thereof. The gate insulation layer may comprise at least one of an organic material, an inorganic material and/or an organic and inorganic material. An active layer 125 may comprise at least one of zinc oxide (ZnO), indium zinc oxide (IZO), indium gallium zinc oxide (IGZO), amorphous silicon, polycrystalline silicon and crystalline silicon.

In the micro-LED element of the present disclosure, as described above, the multilayer electrode part is disposed on the outer circumferential surface of the insulation layer, ensuring excellent emission properties. Further, the micro-LED element of the present disclosure may be highly applicable to a fluid-based assembly technology.

The embodiments are described above with reference to a number of illustrative embodiments thereof. However, embodiments are not limited to the embodiments and drawings set forth herein, and numerous other modifications and embodiments can be drawn by one skilled in the art within the technical scope of the disclosure. Further, the effects and predictable effects based on the configurations in the disclosure are to be included within the range of the disclosure though not explicitly described in the description of the embodiment.

The invention claimed is:

1. A micro-LED element, comprising:
an n-type semiconductor layer;
an active layer being disposed on the n-type semiconductor layer;
a p-type semiconductor layer being disposed on the active layer;
an insulation layer surrounding an outer perimeter surface of the active layer at least; and
a multilayer electrode part being disposed on an outer perimeter surface of the insulation layer,
wherein the multilayer electrode part comprises:
a first layer disposed directly on the insulation layer, the first layer comprising one or more of Ni, Cr, Al, Ti and Au; and
a second layer disposed directly on the first layer, the second layer comprising one or more of Al, Au, Ni, Ti, In, Ag, Mg and Cu.

2. The micro-LED element of claim 1, wherein the multilayer electrode part further comprises a third layer disposed directly on the second layer and comprising one or more of Pt, Sn, Pb, Cu, Ag, and Au.

* * * * *